(12) United States Patent
Thuis

(10) Patent No.: US 6,572,287 B1
(45) Date of Patent: Jun. 3, 2003

(54) ASSEMBLY OF AN IMPEDANCE TRANSFORMER AND A BALUN TRANSFORMER

(75) Inventor: Robbert C. Thuis, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/531,939

(22) Filed: Mar. 21, 2000

(30) Foreign Application Priority Data

Mar. 23, 1999 (EP) .............................. 99200874

(51) Int. Cl.⁷ ................................ H03H 7/38
(52) U.S. Cl. ...................... 398/202; 336/180; 323/355; 323/370
(58) Field of Search ................. 323/355–370; 336/180; 359/189

(56) References Cited

U.S. PATENT DOCUMENTS

| | | | | |
|---|---|---|---|---|
| 4,201,962 A | * | 5/1980 | Hosoya | 333/25 |
| 5,497,137 A | * | 3/1996 | Fujiki | 336/200 |
| 5,767,754 A | * | 6/1998 | Menna | 333/25 |

* cited by examiner

*Primary Examiner*—Leslie Pascal
*Assistant Examiner*—David Payne
(74) *Attorney, Agent, or Firm*—Daniel J. Piotrowski

(57) ABSTRACT

The invention relates to an arrangement of two cascaded transformers, i.e. an impedance transformer (24) and a balance-unbalance transformer, also referred to as balun transformer (26). A relatively simple, inexpensive, small and efficient construction of this arrangement is achieved by mounting both transformers (24, 26) on a single core (50) of a magnetic material. The arrangement according to the invention can be used in CATV networks, more specifically in CATV modules and optical receivers for use in such CATV networks.

6 Claims, 3 Drawing Sheets

ASSEMBLY OF AN IMPEDANCE TRANSFORMER AND A BALUN TRANSFORMER

The invention relates to an assembly of an impedance transformer and a balun transformer, said impedance transformer and said balun transformer being connected in cascade.

The invention also relates to an amplifier and an optical receiver provided with such an assembly.

Such an assembly of an impedance transformer and a balun transformer is known and, inter alia, used in the CATV amplifier module BGD 902 made by Philips. Such CATV amplifier modules are used in coaxial cable networks to maintain the signal level. To this end, these CATV amplifier modules comprise a cascade connection of, respectively, an input stage, an amplifier stage and an output stage. With respect to these CATV amplifier modules, very high distortion requirements are to be met, so that the amplifier stages are generally embodied so as to be symmetrical push-pull amplifiers. Due to this measure, the second-order products formed cancel each other in the output stage. In this respect, it is very important that both amplifier branches are symmetrically driven and loaded. An additional advantage obtained by symmetrically driving and loading the amplifier branches is that relatively few third-order distortion products are introduced into the output signal. In the known CATV amplifier module, the output stage consists of an assembly of an impedance transformer and a balance-unbalance transformer, also known as balun transformer. In the known CATV amplifier module, the impedance transformer ensures that a desired impedance transformation between the amplifier stage and the output of the amplifier module is obtained, so that an optimum power transfer between the output of the amplifier module and the network can be achieved. The balun transformer matches the symmetrical amplifier outputs are to an asymmetric output.

The construction of the known assembly of an impedance transformer and a balun transformer is relatively complicated and expensive. In addition, the known assembly causes relatively high signal losses.

It is an object of the invention to provide an assembly of the type mentioned in the opening paragraph, the construction of which is relatively simple and inexpensive, and which assembly causes relatively low signal losses.

To achieve this, the assembly in accordance with the invention is characterized in that the impedance transformer and the balun transformer are mounted on a single core of magnetic material.

In the known assembly, the impedance transformer and the balun transformer both have their own core. By combining the impedance transformer and the balun transformer on a single core, an assembly is obtained which is functionally equal to the known assembly but the construction of which is simpler and smaller. It has further been found that the signal losses have decreased with respect to the known assembly.

A first embodiment of the assembly in accordance with the invention is characterized in that the balun transformer comprises a transmission line transformer. By virtue of the fact that the primary and the secondary winding in a transmission line transformer exhibit a uniform capacitive coupling, the use of such a transmission line transformer results in a balun transformer exhibiting a relatively good symmetry over a relatively large frequency range.

A second embodiment of the assembly in accordance with the invention is characterized in that the impedance transformer comprises an autotransformer. As the autotransformer has only one winding, the impedance transformer is relatively simple and inexpensive.

A third embodiment of the assembly in accordance with the invention is characterized in that the autotransformer comprises a series connection of, respectively, first, second, third and fourth coils, which series connection is arranged between a first and a second terminal, the series connection comprising a first branching point between the first and the second coil, and the series connection comprising a first ground point between the second and the third coil, the series connection comprising a second branching point between the third and the fourth coil, and the transmission line transformer comprising a primary and a secondary coil, the primary coil being arranged between the first branching point and a third terminal, and the secondary coil being arranged between the second branching point and a second ground point, a first number of turns of the primary coil being equal to a second number of turns of the second coil, and a third number of turns of the third coil being equal to a fourth number of turns of the secondary coil, the first number of turns being equal to the fourth number of turns. Due to the fact that the transmission line transformer and the autotransformer are mounted on the same core, a magnetic coupling is formed between the coils of these two transformers. This magnetic coupling is such that if the number of turns of the secondary coil of the transmission line transformer is unequal to the number of turns of the third coil of the autotransformer, a large and undesirable compensating current starts to flow between the parallel-arranged coils. If, on the other hand, the number of turns of the secondary coil and the third coil are equal, the voltages carried by both coils are in-phase and of the same amplitude, so that the compensating current does not occur anymore.

These and other aspects of the invention will be apparent from and elucidated with reference to the embodiments described hereinafter.

IN THE DRAWINGS:

In the Figures, like reference numerals refer to like parts.

Figure 1:
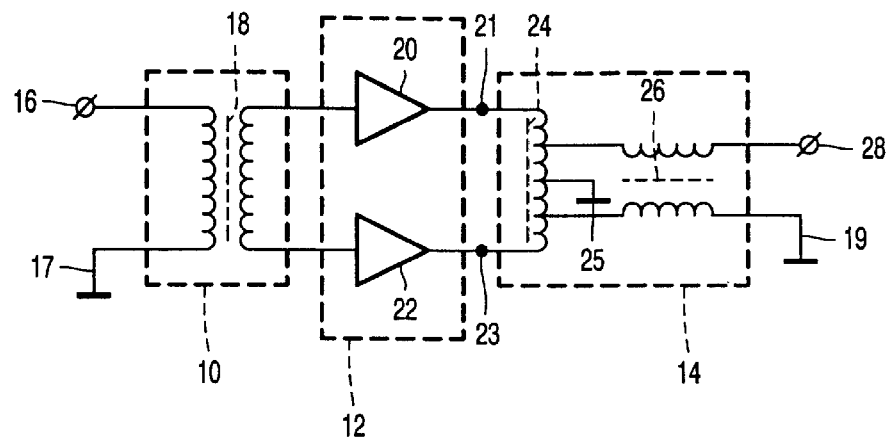
FIG. 1 shows a diagram of an amplifier.

FIG. 1 shows a diagram of an amplifier as used, inter alia, in CATV networks to maintain the signal level. An example of such a well-known amplifier is the CATV amplifier module BGD 902 which is made by Philips. The amplifier comprises a cascade connection of, respectively, an input stage 10, an amplifier stage 12 and an output stage 14. Via an input 16, the input stage 10 can receive broadband (for example in the range between 40 and 900 MHz) input signals. The input stage 10 is grounded via a ground point 17. The input stage 10 is provided with an input transformer 18 which converts the asymmetric input signals to signals which are symmetric in pairs. These symmetric signals are converted in the amplifier stage 12 to amplified symmetric signals. With respect to CATV amplifier modules, very high distortion requirements are to be met, which is the reason why the amplifier stages 12 are generally embodied so as to be symmetrical push-pull amplifiers. In FIG. 1, the amplifier stage 12 is embodied so as to be a symmetrical push-pull amplifier comprising two amplifier branches 20 and 22. By using a symmetrical push-pull amplifier, the second-order products developed in the output stage 14 cancel each other. In this respect, it is very important that the two amplifier branches 20 and 22 are symmetrically driven and loaded. This also applies to the third-order distortion because it is necessary to preclude that both amplifier branches 20 and 22 are not responsible to the same extent for the output power. Finally, the amplified symmetric signals are supplied by the output stage 14 to an output 28. The output stage 14, which is connected to ground via a ground point 29, comprises an assembly of an impedance transformer 24 and a balance-unbalance transformer, also referred to as balun transformer 26. The impedance transformer 24 and the balun transformer 26 are connected in cascade. The impedance transformer 24 may be embodied so as to be, for example, an autotransformer 24, the center of the coil of the autotransformer 24 being connected to ground via a ground point 25. The impedance transformer 24 ensures that a desired impedance transformation between the amplifier stage 12 and the output 28 of the amplifier module is obtained, so that an optimum power transfer between the output 28 of the amplifier module and the network can be achieved. The balun transformer 26 ensures that the symmetrical amplifier outputs 21 and 23 are adapted to the asymmetrical output 28.

To ensure that at high frequencies the primary and the secondary winding of a transformer are sufficiently coupled, it is necessary, prior to winding through the core, to intertwine the wires. Due to the resultant parasitic capacitance between the primary and secondary windings, it is impossible to obtain a conventional balun transformer which operates satisfactorily at higher frequencies. In the case of a transmission line transformer, the voltage difference between the primary and the secondary winding, viewed in the longitudinal direction along the coils, is constant so that the capacitive current is equally divided among the coils. It has been found that, as a result thereof, the transmission line transformer used as a balun transformer functions excellently and in a very broad band.

Figure 2:
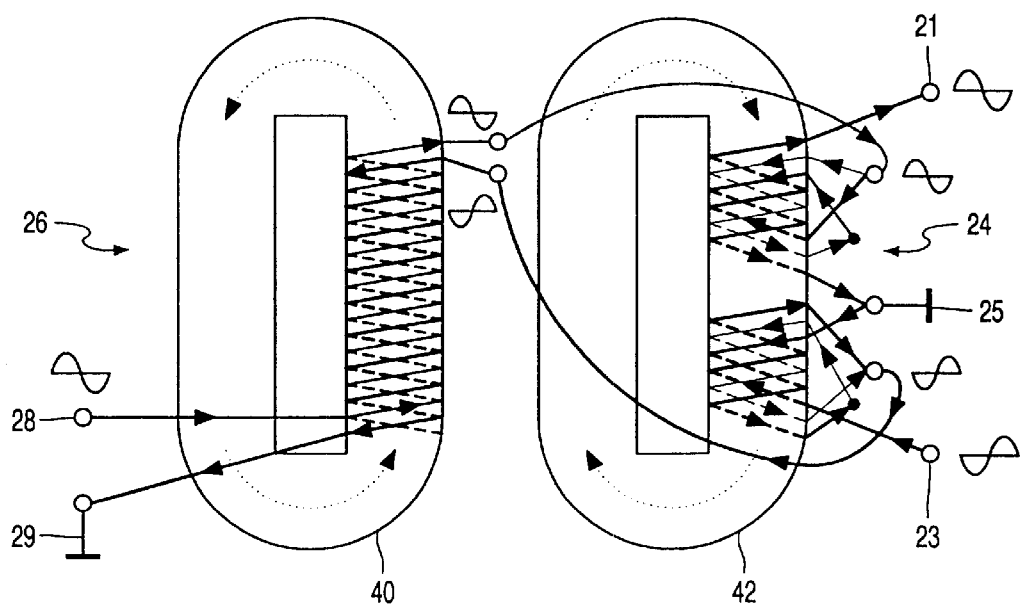
FIG. 2 shows a wiring diagram of a known assembly of an impedance transformer and a balun transformer.

FIG. 2 shows a wiring diagram of the above-described, well-known assembly of an impedance transformer 24 and a balun transformer 26. For clarity, the wires are shown in the non-twisted state. The impedance transformer 24 comprises an autotransformer 24 which is built up around a core 42. The balun transformer 26 comprises a transmission line transformer 26 which is built up around a core 40. The cores 40 and 42 comprise a magnetic material, for example ferrite or ferroxcube. To obtain a satisfactory HF coupling, the coils of the transmission line transformer 26 are intertwined. For the same reason, also the coils of the autotransformer 24 are intertwined, by providing two turns through the core 42, to the left and to the right of the ground point 25, using three intertwined wires. In view of the fact that the magnetic field is concentrated predominantly in the hole of the core 42, the number of "turns" is to be taken to mean, in practice, the number of times that the wires are passed through the hole of the core 42. Measurements show that the described, well-known assembly of an impedance transformer 24 and a balun transformer 26 have signal losses of approximately 0.75 dB at 40 MHz.

Figure 3:
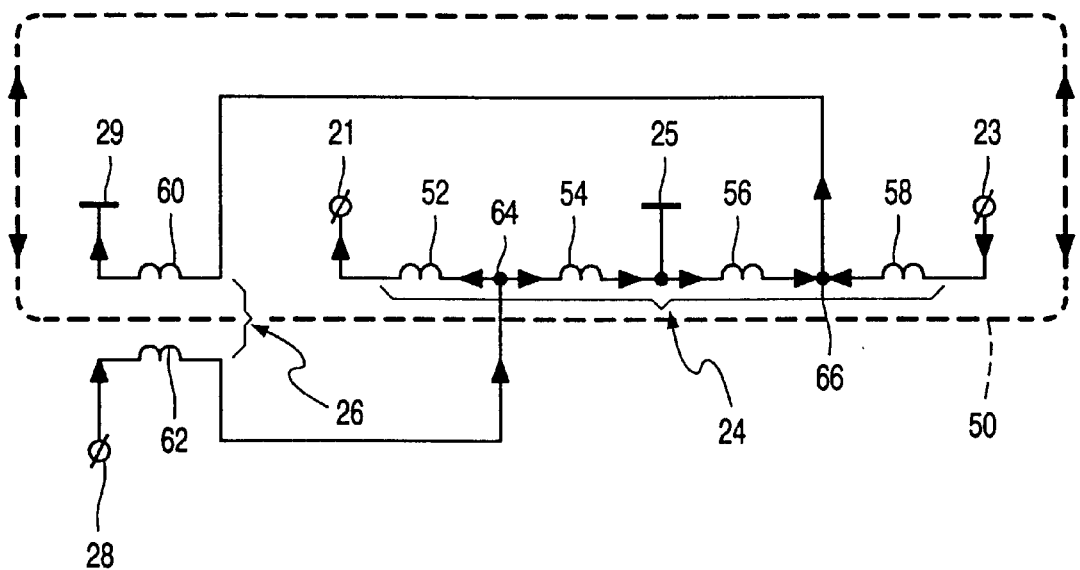
FIG. 3 shows a circuit diagram of an assembly of an impedance transformer and a balun transformer in accordance with the invention.

FIG. 3 shows a circuit diagram of an assembly of an impedance transformer 24 and a balun transformer 26 in accordance with the invention, wherein both transformers are mounted on a single core 50 (diagrammatically shown in the Figure) of a magnetic material. The impedance transformer 24 is formed by an autotransformer 24 which comprises a series connection of, respectively, a first coil 52, a second coil 54, a third coils 56 and a fourth coil 58 which are arranged between a first terminal 21 and a second terminal 23. Between the first coil 52 and the second coil 54, the series connection has a first branching point 64. The series connection is further provided with a first ground point 25 which is situated between the second coil 54 and the third coil 56. The series connection further comprises a second branching point 66 between the third coil 56 and the fourth coil 58. The balun transformer 26 is formed by a transmission line transformer 26 which comprises a primary coil 62 and a secondary coil 60. Said primary coil 62 is arranged between the first branching point 64 and a third terminal 28, and the secondary coil 60 is arranged between the second branching point 66 and a second ground point 29.

It has been found that merely combining both transformers on a single core is not very well possible. The third coil 56 of the autotransformer 24 is connected in parallel to the secondary coil 60 of the transmission line transformer 26. If these two coils 56 and 60 have an unequal number of turns, then this will lead to a short-circuit, causing a large compensating current to flow through the coils 56 and 60. In addition, if the assembly is to function properly, half the input voltage should be present at the two outputs of the transmission line transformer 26. This condition is not met either if both coils have a different number of turns.

The above-mentioned problems can be solved by providing the primary coil 62, the secondary coil 60, the second coil 54 and the third coil 56 with an equal number of turns, for example four. The secondary coil 60 and the third coil 56 now both carry voltages which are equal in phase and in amplitude, so that a compensating current is no longer possible. In addition, the desired voltage, i.e. half the input voltage, is now present across all four coils 54, 56, 60 and 62, irrespective of whether this is caused by magnetic coupling at low frequencies via the core material or by coupling at high frequencies, whereby the core no longer plays a part.

Figure 4:
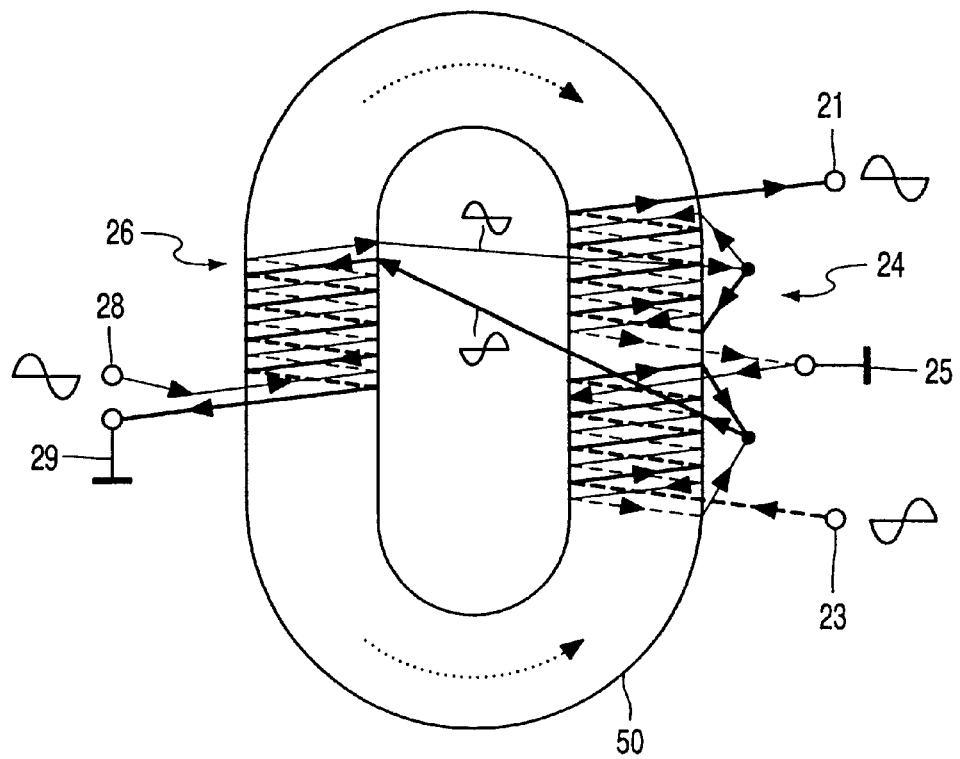
FIG. 4 shows a wiring diagram of an assembly of an impedance transformer and a balun transformer in accordance with the invention.

FIG. 4 shows a wiring diagram of the above-described assembly of an impedance transformer 24 and a balun transformer 26 in accordance with the invention. Also in this case, the wires shown are not intertwined for clarity. The signal losses measured at 40 MHz also depend upon the number of turns of the coils 54, 56, 60 and 62. At four turns, the measured signal losses are approximately 0.6 dB. At eight turns, the signal losses have decreased to approximately 0.3 dB. In fact, the concept presented herein enables many winding combinations. Not only the number of turns of the coils but also the transformation ratio of the autotransformer 24 can be varied.

Figure 5:
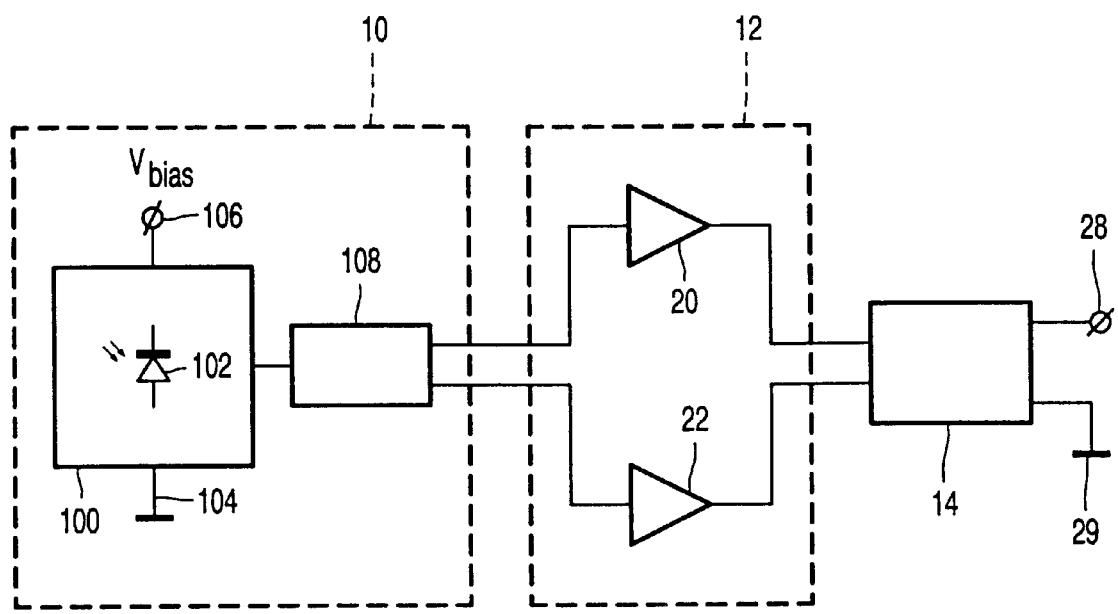
FIG. 5 shows an optical receiver in accordance with the invention.

FIG. 5 shows an optical receiver in accordance with the invention. Such optical receivers are used, for example, in so-called HFC networks, wherein a part of the network consists of glass-fiber cables and another part of coaxial cables. Via the glass-fiber cables, optical signals are sent, while via the coaxial cables electric signals are sent. At the transition from the glass-fiber part to the coaxial part, optical signals must be converted to electrical signals and conversely. The conversion of an optical signal into an amplified electrical signal can be carried out by an optical receiver in accordance with the invention. This optical receiver comprises an input stage 10, an amplifier 12 and an output stage 14 which are cascaded. The input stage 10 receives broadband optical input signals which are converted to electrical signals via a suitable element 100, for example a photodiode 102. The input stage 10 is further provided with an adaptation network 108 which provides for impedance adaptation and for the conversion of each of the electrical signals to two symmetric electrical signals. In the amplifier stage 12, these symmetric signals are converted, by means of two amplifier elements 20 and 22, to amplified symmetric signals, which are converted via an output stage 14 to an asymmetrically amplified electrical signal which is supplied to an output 28. The output stage 14 comprises an assembly of an impedance transformer 24 and a balun transformer 26 in accordance with the invention.

What is claimed is:

1. An assembly of an impedance transformer and a balun transformer, said impedance transformer and said balun transformer being connected in cascade and are mounted on a single core of magnetic material, wherein the impedance transformer includes a series connection of a plurality of coils, the series connection having a plurality of branching points between respective coils, and at least one ground point between respective coils, and wherein the balun transformer includes a primary and a secondary coil, the primary and a secondary coil having at least one predetermined number of turns ratio.

2. An assembly as claimed in claim 1, wherein the balun transformer comprises a transmission line transformer.

3. An assembly as claimed in claim 2, wherein the impedance transformer comprises an autotransformer.

4. An assembly as claimed in claim 3, wherein the autotransformer comprises a series connection of, respectively, first, second, third and fourth coils, which series connection is arranged between a first and a second terminal, the series connection comprising a first branching point between the first and the second coil, and the series connection comprising a first ground point between the second and the third coil, the series connection comprising a second branching point between the third and the fourth coil, and the transmission line transformer comprising a primary and a secondary coil, the primary coil being arranged between the first branching point and a third terminal, and the secondary coil being arranged between the second branching point and a second ground point, a first number of turns of the primary coil being equal to a second number of turns of the second coil, and a third number of turns of the third coil being equal to a fourth number of turns of the secondary coil, the first number of turns being equal to the fourth number of turns.

5. An amplifier comprising an input stage, an amplifier and an output stage which are cascaded, the input stage receiving broadband input signals via an input, and the amplifier converting the input signals to amplified signals, the output stage supplying the amplified signals to an output, and the output stage comprising an assembly of an impedance transformer and a balun transformer being connected in cascade, wherein the impedance transformer and the balun transformer are mounted on a single core of magnetic material and wherein the impedance transformer includes a series connection of a plurality of coils, the series connection having a plurality of branching points between respective coils, and at least one ground point between respective coils, and wherein the balun transformer includes a primary and a secondary coil, the primary and a secondary coil having at least one predetermined number of turns ratio.

6. An optical receiver comprising an input stage, an amplifier and an output stage which are cascaded, the input stage receiving broadband optical input signals and converting these signals to electrical signals, the amplifier converting the electrical signals to amplified electrical signals, the output stage supplying the amplified electrical signals to an output, and the output stage comprising an assembly of an impedance transformer and a balun transformer being connected in cascade, wherein the impedance transformer and the balun transformer are mounted on a single core of magnetic material and wherein the impedance transformer includes a series connection of a plurality of coils, the series connection having a plurality of branching points between respective coils, and at least one ground point between respective coils, and wherein the balun transformer includes a primary and a secondary coil, the primary and a secondary coil having at least one predetermined number of turns ratio.

* * * * *